US006806568B2

(12) United States Patent
Schaper

(10) Patent No.: US 6,806,568 B2
(45) Date of Patent: Oct. 19, 2004

(54) DECOUPLING CAPACITOR FOR INTEGRATED CIRCUIT PACKAGE AND ELECTRICAL COMPONENTS USING THE DECOUPLING CAPACITOR AND ASSOCIATED METHODS

(75) Inventor: Leonard W. Schaper, Fayetteville, AR (US)

(73) Assignee: The Board of Trustees of the University of Arkansas, Little Rock, AR (US)

( * ) Notice: Subject to any disclaimer, the term of this patent is extended or adjusted under 35 U.S.C. 154(b) by 0 days.

(21) Appl. No.: 09/908,751

(22) Filed: Jul. 20, 2001

(65) Prior Publication Data

US 2003/0015783 A1 Jan. 23, 2003

(51) Int. Cl.[7] ............................................... H01L 23/34
(52) U.S. Cl. ..................... 257/724; 257/528; 257/532; 257/535
(58) Field of Search ............................... 257/724, 528, 257/532, 535; 438/329, 951

(56) References Cited

U.S. PATENT DOCUMENTS

| | | | | |
|---|---|---|---|---|
| 4,453,176 A | * | 6/1984 | Chance et al. ............... 257/778 |
| 4,551,746 A | | 11/1985 | Gilbert et al. ................ 357/74 |
| 4,577,214 A | | 3/1986 | Schaper ........................ 357/74 |
| 4,626,958 A | | 12/1986 | Lockard et al. .............. 361/306 |
| 4,654,694 A | | 3/1987 | Val ............................... 357/74 |
| 4,667,267 A | | 5/1987 | Hernandez et al. .......... 361/306 |
| 4,734,818 A | | 3/1988 | Hernandez et al. .......... 361/306 |
| 4,744,008 A | | 5/1988 | Black et al. .................. 361/386 |
| 4,922,324 A | | 5/1990 | Sudo ............................ 357/74 |
| 5,067,005 A | * | 11/1991 | Michii et al. ................ 257/700 |
| 5,089,878 A | | 2/1992 | Lee .............................. 357/71 |
| 5,095,402 A | | 3/1992 | Hernandez et al. .......... 361/306 |
| 5,103,283 A | * | 4/1992 | Hite ............................. 257/724 |
| 5,237,204 A | | 8/1993 | Val ............................... 257/698 |
| 5,258,575 A | | 11/1993 | Beppu et al. ................ 174/52.4 |
| 5,281,846 A | * | 1/1994 | Kaiser ......................... 257/528 |
| 5,283,717 A | * | 2/1994 | Hundt ......................... 361/813 |
| 5,422,782 A | * | 6/1995 | Hernandez et al. ......... 361/306.2 |
| 5,471,027 A | * | 11/1995 | Call et al. ................... 219/85.13 |
| 5,666,004 A | | 9/1997 | Bhattacharyya et al. .... 257/724 |
| 5,831,810 A | | 11/1998 | Bird et al. ................... 361/301 |
| 5,881,945 A | * | 3/1999 | Edwards et al. ............ 228/124.6 |
| 5,926,951 A | | 7/1999 | Khandros et al. ............ 29/843 |
| 6,027,980 A | * | 2/2000 | Gardner ....................... 438/396 |
| 6,049,465 A | | 4/2000 | Blish, II et al. ............. 361/767 |
| 6,104,082 A | | 8/2000 | Berlin et al. ................. 257/665 |
| 6,144,090 A | | 11/2000 | Higashiguchi ............... 257/693 |
| 6,165,814 A | | 12/2000 | Wark et al. .................. 438/108 |
| 6,184,567 B1 | * | 2/2001 | Fujisawa et al. ............ 257/532 |
| 6,184,568 B1 | | 2/2001 | Protigal et al. ............. 257/535 |
| 6,222,246 B1 | * | 4/2001 | Mak et al. ................... 257/532 |
| 6,300,161 B1 | * | 10/2001 | Goetz et al. ................ 438/106 |
| 6,413,353 B2 | * | 7/2002 | Pompeo et al. ............. 156/307.3 |

FOREIGN PATENT DOCUMENTS

JP 59136962 A * 8/1984 ........... H01L/25/00

* cited by examiner

Primary Examiner—Tom Thomas
Assistant Examiner—Eugene Lee
(74) Attorney, Agent, or Firm—Miles & Stockbridge P.C.

(57) ABSTRACT

A capacitive structure is made with thin film capacitor plates substantially surrounding an opening cavity for accommodating a chip. The capacitive structure includes at least one capacitor and is mounted around the periphery of a ball grid array (BGA) having a flip chip in the opening. The capacitive structure provides a high capacitance with a low parasitic inductance.

17 Claims, 2 Drawing Sheets

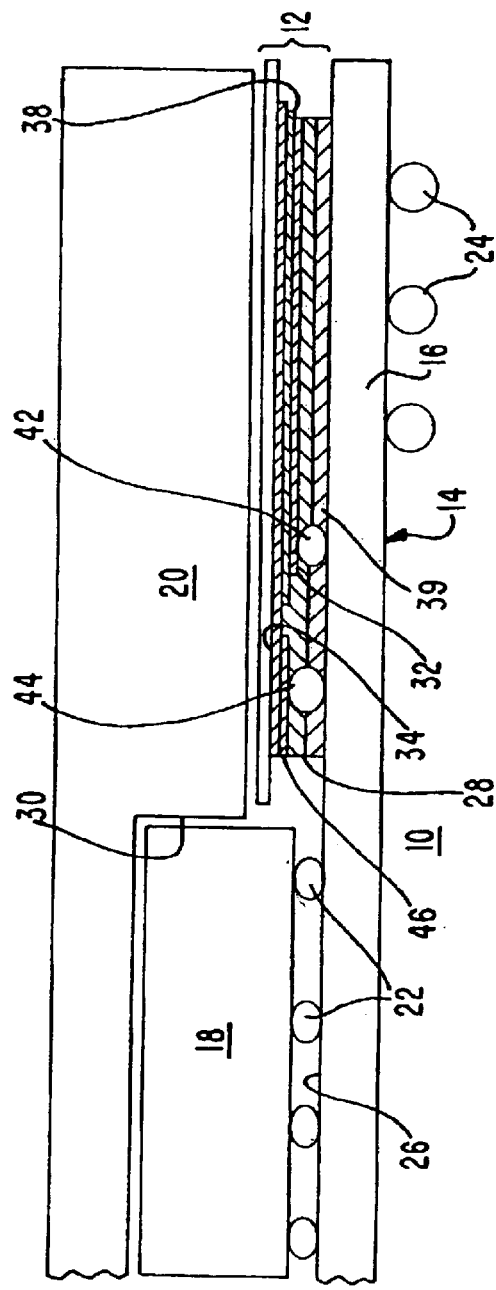
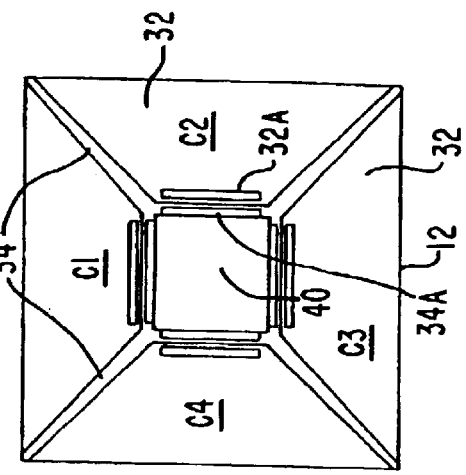
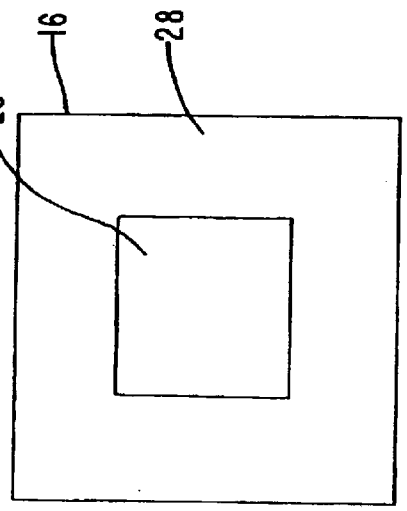

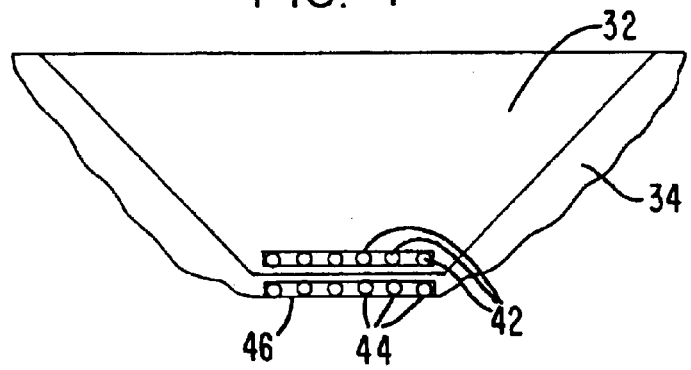
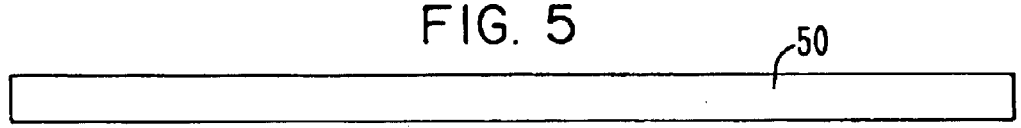
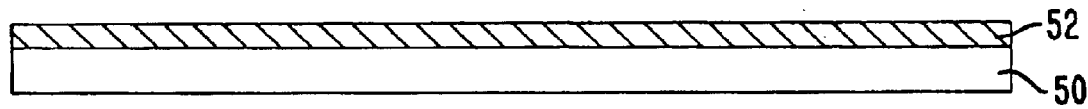
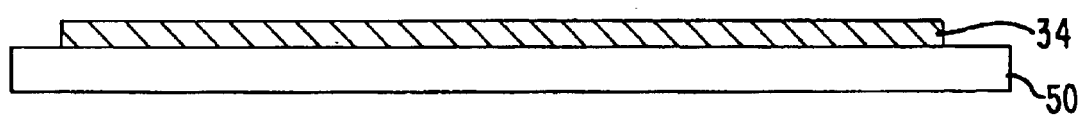
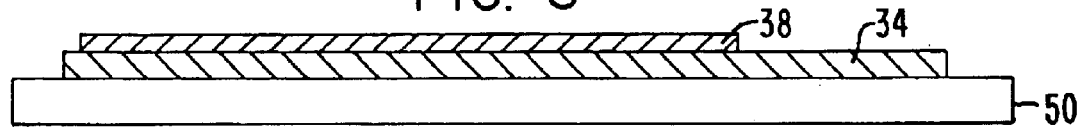
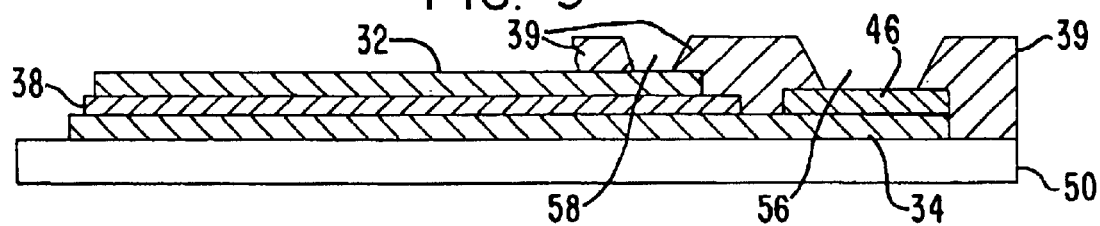

DECOUPLING CAPACITOR FOR INTEGRATED CIRCUIT PACKAGE AND ELECTRICAL COMPONENTS USING THE DECOUPLING CAPACITOR AND ASSOCIATED METHODS

BACKGROUND OF THE INVENTION

This invention relates to a decoupling capacitive structure (i.e., a structure including one or more capacitors) and electrical components including the capacitive structure, and to production methods thereof.

When designing a package for an integrated circuit chip such as a flip chip or a wire bond chip, a ball grid array (BGA) or other area array or peripheral leaded package is used to allow input/output (I/O) connections to numerous terminals on the chip. The package basically serves as a spatial adaptor between the relatively large terminals on a printed wiring board (PWB) and the much smaller terminals or connection points on the chip itself.

As part of the power delivery system to the chip, one or more decoupling capacitors (also called bypass capacitors) are often used as a charge reservoir such that any sudden requirement for current can be supplied to the chip with the voltage maintained constant or nearly constant. Additionally, the capacitors minimize transient currents in the power supplied to the chip. The capacitors are in parallel with a source supply and its associated load such that transient currents pass through the capacitor and do not reach the load.

With increased switching speeds in chips, such as microprocessor chips, parasitic inductances in the power distribution system become increasingly problematical because, among other things, they impair the performance of decoupling capacitors. The parasitic inductances include inductances in the decoupling capacitors themselves as well as in the circuit paths from the capacitors to the chip. Basically, the connections between any capacitor and the chip introduce additional parasitic inductance beyond the parasitic inductance of the capacitor itself. Capacitors that are distant from the chip do not provide satisfactory decoupling at higher switching speeds. In general, the farther from the chip, the greater the parasitic inductance and the less effective the capacitor in decoupling high frequency transients.

Various techniques have been proposed to place the decoupling capacitors as close as possible to the chip.

One technique has involved putting decoupling capacitors within the chip itself, but that disadvantageously restricts the number of transistors that can be placed in the chip. Additionally, the capacitance values are relatively low.

Another technique uses placement of one or more discrete chip capacitors (typically stacked, co-fired ceramic capacitors) around the periphery of the package to which the chip will be attached. Unfortunately, such capacitors have higher parasitic inductance than desirable. Again, this is especially troublesome when operating at high switching speeds due to reduced decoupling performance. Further, discrete chip capacitors, being relatively thick, require customizing (e.g., milling out cavities to accommodate the capacitors) of a heat sink and/or other component (stiffener or spacer) mounted as part of the top of the package made with the chip and package substrate.

SUMMARY OF THE INVENTION

The present invention avoids the stated drawbacks of the various capacitor arrangements discussed.

An object of the present invention is to provide a new and improved capacitive structure useful in a decoupling arrangement for a ball grid array (BGA) or other chip package.

A more specific object of the invention is to provide high capacitance and low parasitic inductance decoupling arrangement for a chip power supply.

Yet another object of the invention is to provide a decoupling arrangement for use with a BGA or other chip package without requiring special milling or other customization of a heat sink or other part mounted on a chip.

Still another object of the invention is to provide methods of making a capacitive structure and devices incorporating the capacitive structure.

The above and other objects of the present invention are realized by building a thin film capacitive structure on thin flexible polymer material and mounting that capacitive structure on otherwise unused portions of the chip package. The thin film capacitive structure has intrinsically high capacitance density and low parasitic inductance.

According to one of its aspects, the present invention may be described as an electrical component including an integrated circuit package having a substrate with a chip side, an opposite side opposite to the chip side, and connection points for a chip on the chip side of the substrate. The chip side of the substrate has a chip area for disposition of a chip and a chip-side remainder area. The opposite side of the substrate has an opposite-side connection area and an opposite-side remainder area. A decoupling structure includes at least a first decoupling capacitor having two different capacitor plates spaced apart with dielectric therebetween. The capacitor plates are films preferably no more than 5 microns in thickness. The capacitor plates are disposed in one of the remainder areas. Preferably, the decoupling structure includes capacitor plates covering at least 70 percent of the one remainder area. The chip area is preferably centrally located on the chip side and the chip-side remainder area extends peripherally around the chip area, and the decoupling structure is disposed in the chip-side remainder area. The two capacitor plates may include one plate that substantially encircles the chip area. The chip side of the substrate may define a plane (i.e., is either a plane or substantially planar with some deviations from a defined plane), with the two capacitor plates being spaced apart in a direction normal to the plane. The aforementioned one plate may cover at least 70 percent of the chip-side remainder area, and the decoupling structure is preferably an applique applied to a surface of the substrate.

The electrical component may further include a chip disposed on the chip area and electrically connected at the connection points, and a heat sink disposed on a side of the chip opposite the substrate, the decoupling structure not requiring any cavities in the heat sink for accommodating the decoupling structure. The decoupling structure may have a thickness less than half the thickness of the chip, which may be a flip chip.

In a preferred form, the decoupling structure provides at least 100 nF of capacitance per square centimeter of area of one of the capacitor plates. The decoupling structure may include a second decoupling capacitor having two capacitor plates spaced apart with dielectric therebetween, one of the capacitor plates of the second decoupling capacitor being a common plate also serving as one of the capacitor plates of the first decoupling capacitor, all of the capacitor plates preferably being thin films with thicknesses of no more than 5 microns, with the dielectric between any two of the capacitor plates being no more than 1 micron in thickness.

According to another of its aspects, the invention may alternately be described as an electrical component including a decoupling structure including first and second metal layers spaced apart with dielectric therebetween so as to define at least a first decoupling capacitor having at least two different plates, at least one of the metal layers substantially surrounding an interior opening through the decoupling structure, the metal layers preferably having thicknesses of no more than 5 microns. The decoupling structure may provide at least 100 nF of capacitance per square centimeter of area of one of the capacitor plates and may also have an equivalent parasitic inductance of less than 20 nH for each capacitor in the decoupling structure. Each of the capacitor plates preferably includes connection locations extending alongside the opening, with the dielectric between any two of the capacitor plates being no more than 1 micron in thickness.

The electrical component may further include an integrated circuit package having a substrate with a chip side, an opposite side opposite to the chip side, and connection points for a chip on the chip side of the substrate, the chip side of the substrate having a chip area for disposition of a chip and a chip-side remainder area. The decoupling structure is attached to the chip-side remainder area, the chip side of the substrate defines a plane, and the two capacitor plates are spaced apart in a direction normal to the plane defined by the chip side. A chip is disposed on the chip area and electrically connected at the connection points. A heat sink is disposed on a side of the chip opposite the substrate, the decoupling structure not requiring any cavities in the heat sink for accommodating the decoupling structure.

The decoupling structure may further include one or more additional decoupling capacitors each having two plates spaced apart, with one of the plates of each additional capacitor being constituted by a portion of a plate that is common to all of the capacitors of the structure.

According to yet another aspect, the present invention may be described as an electrical component including an integrated circuit package having a spatial adaptor substrate with a chip side, an opposite side opposite to the chip side, and connection points for a chip on the chip side of the substrate, the chip side of the substrate defining a plane and having a chip area for disposition of a chip and a chip-side remainder area, the opposite side of the substrate having an opposite-side remainder area. The component has a decoupling structure including at least a first decoupling capacitor having two different plates spaced apart from each other in a direction normal to the plane defined by the chip side with dielectric therebetween, the capacitor plates being disposed in one of the remainder areas and covering at least 70 percent of that remainder area. Preferably, the decoupling structure provides at least 100 nF of capacitance per square centimeter of area of one of the capacitor plates, and the capacitor plates are thin films of thicknesses no greater than 5 microns.

According to still another aspect, the present invention may be described as an electrical component including an integrated circuit package having a substrate with a chip side that defines a plane, an opposite side opposite to the chip side, and connection points for a chip on the chip side of the substrate, the chip side of the substrate having a chip area for disposition of a chip and a chip-side remainder area. A decoupling structure includes at least a first decoupling capacitor having two capacitor plates spaced apart in a direction normal to the plane defined by the chip side, the capacitor plates being disposed in the chip-side remainder area and being thin films of thickness no greater than 5 microns and covering at least 70 percent of the chip-side remainder area. The chip area is preferably centrally located on the chip side with the chip-side remainder area substantially encircling the chip area. The two capacitor plates include a ground plate that extends peripherally completely in a closed loop around the chip area.

According to still another aspect, the present invention may be described as a method of making an electrical component, comprising providing a first capacitor plate layer having a thickness of no more than 5 microns, providing a second capacitor plate layer having a thickness of no more than 5 microns, the second capacitor plate layer being separated from the first capacitor plate by a dielectric to form a capacitive structure, and providing a opening through the capacitive structure such that the first and second capacitor plate layers are disposed in a region substantially encircling the opening. Preferably, the method further includes disposing the capacitive structure on an integrated circuit package having a substrate with a chip side, an opposite side opposite to the chip side, and connection points for a chip on the chip side of the substrate, the chip side of the substrate having a chip area for disposition of a chip and a chip-side remainder area, with the capacitive structure being disposed on the chip-side remainder area with the opening positioned in correspondence with the chip area.

According to still another aspect, the present invention may be described as a method of making an electrical component, comprising providing a first capacitor plate layer having a thickness of no more than 5 microns; providing a second capacitor plate layer having a thickness of no more than 5 microns, the second capacitor plate layer being separated from the first capacitor plate by a dielectric to form a capacitive structure, disposing the capacitive structure on an integrated circuit package having a substrate with a chip side, an opposite side opposite to the chip side, and connection points for a chip on the chip side of the substrate, the chip side of the substrate having a chip area for disposition of a chip and a chip-side remainder area, the opposite side of the substrate having an opposite-side connection area and an opposite-side remainder area, and the capacitive structure being disposed on one of the remainder areas.

According to still another aspect, the invention may be described as a method of making an electrical component, comprising providing a first capacitor plate layer, providing a second capacitor plate layer separated from the first capacitor plate layer by a dielectric to form a capacitive structure, and removing a portion of the capacitive structure to form an opening therethrough such that the first and second capacitor plate layers are disposed in a region substantially surrounding the opening.

According to still another aspect, the invention may be described as an electrical component comprising an integrated circuit package having a substrate with a chip side, an opposite side opposite to the chip side, and connection points for a chip on the chip side of the substrate, the chip side of the substrate having a chip area for disposition of a chip and a chip-side remainder area, the opposite side of the substrate having an opposite-side connection area and an opposite-side remainder area; and a decoupling structure including a thin-film decoupling capacitor disposed on one of the remainder areas.

BRIEF DESCRIPTION OF THE DRAWINGS

The invention, including its aforementioned and other objects and aspects, will be more fully appreciated from the accompanying description of the preferred embodiments taken in conjunction with the accompanying drawings in which like numerals represent like parts throughout the several views and in which:

FIG. 1 shows a side view, with parts in cross section, of a package (with a left side broken away) according to the present invention;

FIG. 2 is a cross-sectional plan view looking down at or just above the upper surface of a package substrate;

FIG. 3 is a top view of a capacitive structure before assembly to the substrate of a package such as a BGA;

FIG. 4 is a simplified view of one quadrant of parts of FIG. 3; and

FIGS. 5–9 are side views illustrating steps in the method of making the capacitive structure that is part of the embodiment of FIG. 1.

DESCRIPTION OF THE PREFERRED EMBODIMENTS

Turning now to FIG. 1, a preferred embodiment of an electrical component 10 of the present invention will be described. A capacitive decoupling structure 12 (portions shown in cross section) includes capacitor plates that constitute at least one decoupling capacitor and that will be described below. The decoupling structure 12 is an applique applied to an IC package, in this case a ball grid array (BGA) 14 having a substrate 16. A flip chip 18 and heat sink 20, both of which may be of conventional design, are disposed as shown.

The flip chip 18 is connected to the BGA 14 via solder balls 22 on the chip side (i.e., upper side in FIG. 1) of substrate 16 in known fashion. For ease of illustration, empty spaces are shown between solder balls 22 and between some adjacent portions of decoupling structure 12, substrate 16, flip chip 18, and heat sink 20. However, it will be appreciated that the empty spaces shown would typically be filled in with bonding or other filling materials in known fashion to provide a package without voids. As will be appreciated, the heat sink 20 would have a secure connection to the chip 18 for thermal transfer therebetween. Solder balls 24 would be disposed on an opposite side (i.e., opposite the chip, lower side in FIG. 1) of the substrate 16 for connecting the BGA 14 to a printed circuit board (not shown) or other connections. The BGA thus serves in known fashion as an area array spatial adaptor by allowing connections from relatively large terminals to relatively small connection points on the chip 18.

Continuing to consider FIG. 1, but also considering FIG. 2 (a cross-sectional plan view looking down at or just above the upper surface of substrate 16 and with the bonding or filler material discussed above in place), the chip side of substrate 16 includes a central interior chip area 26 for disposition of a chip and a peripherally extending or encircling remainder area 28 (i.e., area outside of the chip area). In the illustrated embodiment, the chip area has the solder balls 22 or other connection points for the chip. Note that FIG. 1 only shows a right side of area 28, but it extends around the central area as shown in FIG. 2. The lower side of substrate 16 has a remainder area including the surface apart from the connection area corresponding to solder balls 24 or similar connection points. The heat sink 20 includes a cavity 30 to accommodate the chip 18.

Considering FIGS. 1 and 2 in conjunction, the area 28 commonly goes unused in prior designs. That is, prior designs often use packages having components such as BGA 14, flip chip 18, and heat sink 20 (alternatively or additionally a spacer or stiffener, not shown)but, of course, without the decoupling structure 12. In the present invention, the BGA 14 is modified from prior designs to allow it to connect to the decoupling structure as will be described.

As discussed above, some prior designs use discrete chip capacitors in the area 28, but as mentioned above and best understood in connection with FIG. 1, such capacitors would create a bump projecting upwardly in area 28. This would in turn require that the heat sink 20 (and/or stiffener or spacer) have a cavity therein other than the cavity 30 of FIG. 1 in which the chip is disposed, thereby complicating the manufacture of the heat sink 20 (and/or any stiffener or spacer used).

The present invention advantageously uses the remainder area 28 for the unique decoupling structure 12 without requiring complex additional steps in manufacture for the heat sink 20 (and/or any stiffener or spacer used). Further, the decoupling structure 12 provides an extremely low intrinsic parasitic inductance and extremely low parasitic inductance in its connections to the flip chip 18 via the BGA 14.

Continuing to view FIG. 1, but also viewing FIG. 3 (a top view of capacitive structure 12 before assembly onto BGA 14), the illustrative decoupling structure 12 includes four quadrant capacitor plates 32, each of which is part of a corresponding decoupling capacitor. Specifically, the four quadrant plates 32 are respectively parts of first, second, third, and fourth capacitors C1 to C4, all sharing a common or ground plate 34. The ground plate 34 extends above the quadrant plates 32, preferably at least co-extensively with the plates 32, and is separated therefrom by dielectric 38 (FIG. 1 only).

While the decoupling structure 12 has four capacitors in the illustrated embodiment, the invention is not limited to any particular number of capacitors. For example, the quadrant plates could all be replaced by a single plate occupying substantially the same area, in which case the decoupling structure 12 would provide a single decoupling capacitor substantially encircling the chip 18. Alternatively, a plurality of plates 32 could be electrically connected in one or more groups through one or more power planes buried in substrate 16 to form a corresponding number of capacitors each having a plurality of physically distinct but electrically connected plates 32 and sharing the common or ground plate 34. Depending on the requirements for decoupling power supplied to chip 18, the decoupling structure could have one to four or more capacitors by suitably arranging one or more or plates 32. Advantageously, the structure can provide decoupling for a plurality of power distribution planes by coupling the plate or plates 32 of each capacitor to a corresponding one of the power distribution planes (which may be at different voltages).

As shown in FIG. 3, a chip-accommodating opening 40 extends completely through the decoupling structure 12. Also shown are rectangular areas 32A and 34A, which are portions of plates 32 and 34 that will be used for connection to substrate 16, as shown in FIG. 1.

With reference to FIG. 4 (a simplified view of one quadrant of the decoupling structure 12) and FIG. 1, each plate 32 has a series of solder balls 42 in a row along its inner edge (i.e., part of plate 32 closest to opening 40 of FIG. 3). The ground plate 34 has a series of solder balls 44 in a row along each of its four inner edges (corresponding to the four quadrants). Solder ball connection areas are defined by circular openings in a soldermask material, above connection areas 32A and 34A Just over one quadrant of the ground plate 34 is shown in FIG. 4, whereas other portions are shown broken away in FIG. 4. The ground plate 34 preferably corresponds in shape with area 28 of FIG. 2 and is preferably co-extensive (or at least substantially co-extensive) with area 28. Any suitable connection medium, such as conductive epoxy, could be used instead of the solder balls 42 and 44.

With reference now to FIGS. 5–9, the steps of making the decoupling structure 12 according to the preferred embodiment will be discussed. All of these FIGS. show only one quadrant of the structure 12, but it will be understood that the overall shape of structure 12 is that of area 28 in FIG. 2.

FIG. 5 shows flex 50 (such as KAPTON tape) used as a starting material. Again, it would be in the shape of and substantially co-extensive with area 28 of FIG. 2, thus encircling the interior or central area. However, for fabrication purposes, this area is not cut out until the capacitor fabrication is completed. A layer of copper 52 is deposited, as by sputtering, on one side of the flex 50 as shown in FIG. 6. A very thin layer of titanium (not separately shown) may be deposited on flex 50 prior to the copper to improve adhesion of the copper 52 to the flex. Alternatively, the base material could be a copper foil, thus combining elements 50 and 52. In this case, the patterning described below would not be done.

In FIG. 7, the copper 52 (and any titanium) has been patterned as shown, thus forming the common or ground plate 34. As with the other capacitor plates that are discussed herein, the thickness of plate 34 is preferably no more than 5 microns. Although the preferred embodiment uses a common ground plate 34, the present invention also may be realized by different ground plates for the different quadrants or other patterns used for the plates 32.

Next, tantalum is sputtered to the top of the structure of FIG. 7, after which the tantalum is anodized and then etched to leave an area of dielectric 38 shown in FIG. 8 (and FIG. 1). The dielectric is preferably tantalum pentoxide with a thickness of no more than 1 micron. Alternatively, the tantalum layer could be selectively anodized to create the tantalum pentoxide dielectric only in area 38.

A layer of copper is next deposited, as by sputtering on the top of the FIG. 8 structure and is then patterned to form plate 32 and a connection strip 46 as shown in FIG. 9. If using a plurality of plates 32 as discussed in connection with FIGS. 3 and 4, the process would provide separation between the plates as illustrated in FIG. 3. However, the layer corresponding to plates 32 could be constructed to realize one to four capacitors or even more than four (e.g., by subdividing the quadrant plates.) Again, a very thin layer of titanium (not separately shown) may be deposited prior to the copper deposition. A soldermask 39 (portions broken away in FIG. 9 for ease of illustration) would then be printed in the illustrated pattern to define openings 56 and 58 through which solder balls 44 and 46 (FIGS. 1 and 4 only) electrically connect the BGA 14 (FIG. 1, not shown in FIG. 9) respectively to the plates 32 and 34. Finally, the interior chip accommodating area is cut out by any suitable means. It will be understood that variations in deposition, patterning, and anodization may be used to create analogous structures in the spirit of the invention. Moreover, different supporting materials, metals, and dielectrics may be used, those mentioned above merely being exemplary.

Referring back to FIG. 1, the structure of FIG. 9 would be turned upside down (i.e., relative to FIG. 9) after attachment of the solder balls 42 and 44 and mounted upon the area 28 of BGA 14, whereupon the resulting preassembly could be heated in a furnace or by other conventional means to reflow the solder balls and complete the associated electrical connections. The space between surfaces could then be underfilled with polymeric adhesive by conventional techniques to rigidify the structure. If conductive adhesive is used in place to solder balls, non-conductive adhesive could be deposited in the areas away from the conductive adhesive and the capacitive structure 12 then pressed in place on substrate 16, followed by thermal curing of the adhesive.

A decoupling capacitive structure 12 made according to the foregoing process provides 150 nF of capacitance per $cm^2$ of top plate (plate 32) area with less than 10 nH of parasitic inductance (the equivalent parasitic inductance of all the capacitors). Advantageously, the present invention provides at least 100 nF of capacitance per $cm^2$ of top plate area and less than 20 nH inductance for the combined (i.e., equivalent circuit) parasitic inductance of all the capacitors. More preferably, the present invention provides less than 20 nH parasitic inductance for each capacitor in the structure 12. Even more preferably, the present invention provides less than 10 nH parasitic inductance for each capacitor in the structure 12. Further, the overall capacitance of structure 12 is high because the structure 12 has capacitor plates covering preferably at least 70 percent of the associated remainder area of the substrate. More preferably, the capacitor plates cover at least 90 percent of the associated remainder area.

The preferred device or structure is fabricated on flex or similar material and is, say, about 4 mils thick (preferably no greater than 6 mils) including the flex. The thinness of the structure 12 and its planar upper surface (i.e., in FIG. 1, just below heat sink) allows the heat sink 20 (or any stiffener or spacer) to fit with a cavity for the chip 30 and without any need for a cavity to accommodate the decoupling capacitive structure 12. The structure 12 is shaped like a square donut, with a cutout for the chip. As previously mentioned, each quadrant can form one or more separate decoupling capacitors if multiple voltages need to be decoupled. The sections are connected to matching substrate pads by two stripes along each edge of the chip cutout. This minimizes parasitic inductance. Attachment can be by solder bumps or by conductive epoxy. For a 35 mm square BGA package and a 10–15 mm square chip shown, the capacitor may likewise be 35 mm square with a 12–17 mm opening providing an approximately 1 mm clearance around the opening to the chip, the total decoupling capacitance being about 1.3 microfarads. The capacitor dielectric is tantalum pentoxide and the capacitor plates are copper. Electrical performance is far superior to any currently available decoupling capacitor. The substrate should also be designed with a low inductance path from the capacitor pads to the internal power distribution planes.

While a preferred embodiment of the invention has been shown and described, it will be appreciated by those skilled in the art that various modifications can be made in keeping with the basic principles of the invention. For example, the preferred embodiment shows a flip chip 18, but the present invention could also be used for decoupling capacitance in combination with a wire bond chip on a spatial adaptor. Though a BGA has been shown for illustrative purposes, the invention could be used with any chip package having otherwise unused surface area that would accommodate the decoupling capacitor. Although not shown, the thin film decoupling capacitive structure 12 could be shaped differently (e.g., round or rectangular rather than square) and/or mounted on a remainder area of the lower surface in FIG. 1, the remainder area being the area other than the area having solder balls 24 therein. In the latter case, solder balls 24 could be arranged in a marginal area along the perimeter of the substrate with the capacitor structure 12 being disposed in the remainder area surrounded by the marginal area. The central or interior cutout of the structure 12 could be eliminated in such applications. Moreover, while the capacitive structure has been described as a decoupling structure for high frequency transients, it is not limited to such use and can be used for other conventional purposes.

What is claimed is:

1. An electrical component including a thin-film capacitive structure comprising a pair of conductive films separated by a dielectric film, wherein the capacitive structure is a substantially flat annulus and the conductive films have electrical connection elements disposed adjacent to a central opening of the annulus in the thickness direction of the substantially flat capacitive structure.

2. An electrical component according to claim 1, wherein the capacitive structure is based on a flexible tape.

3. An electrical component according to claim 1 further comprising a substrate, to a surface of which the capacitive structure is adhered, and wherein the surface of the substrate has electrical connection points matched with the electrical connection elements of the capacitive structure.

4. An electrical component according to claim 3, wherein the electrical connection elements comprise solder balls.

5. An electrical component according to claim 4, wherein the substrate is a substrate of a ball grid array.

6. An electrical component according to claim 3, wherein the semiconductor device is disposed on the substrate in the central opening of the capacitive structure with a surface adjacent to the surface of the substrate, and has electrical connection elements between the surface of the semiconductor device and electrical connection points on the surface of the substrate.

7. An electrical component according to claim 6, further comprising a heat sink disposed over the semiconductor device and the capacitive structure.

8. An electrical component according to claim 1, wherein at least one of the conductive films of the capacitive structure has separate parts to define corresponding capacitors.

9. An electrical component according to claim 1, wherein the electrical connector elements comprise rows of solder balls.

10. An electrical component according to claim 3, wherein the substrate has an opposite surface with electrical connector elements thereon for connecting the electrical component to another electrical component.

11. An electrical component according to claim 1, wherein the surface of the substrate has an area for disposition of a semiconductor device thereon in the central opening of the capacitive structure, and the capacitive structure occupies at least 70% of the remaining area of the surface of the substrate.

12. An electrical component according to claim 11, wherein the capacitive structure provides at least 100 nF of capacitance per square centimeter of area of one of the conductive films.

13. An electrical component comprising a substrate with a chip area and a remainder area surrounding the chip area, and wherein a thin-film, substantially flat capacitive structure is adhered to the remainder area, surrounds the chip area, and has electrical connector elements that provide conductive paths from the capacitive structure to electrical connection points on the substrate, said paths being disposed in the thickness direction of the capacitive structure and the substrate.

14. An electrical component according to claim 13, wherein the electrical connection elements comprise solder balls.

15. An electrical component according to claim 14, wherein a semiconductor device is disposed in the chip area and is connected to electrical connection points on the substrate by solder balls between the device and the substrate.

16. An electrical component according to claim 13, wherein the capacitive structure is an annulus.

17. An electrical component according to claim 13, wherein the capacitive structure comprises capacitor plates that are thin films with thicknesses of no more than 5 microns and a dielectric between the capacitor plates that is no more than 1 micron in thickness.

* * * * *